United States Patent [19]

Muller et al.

[11] Patent Number: 5,605,600
[45] Date of Patent: Feb. 25, 1997

[54] ETCH PROFILE SHAPING THROUGH WAFER TEMPERATURE CONTROL

[75] Inventors: Karl P. Muller; Klaus B. Roithner, both of Wappingers Falls; Bernhard Poschenrieder, Poughkeepsie; Toru Watanabe, Hopwell Junction, all of N.Y.

[73] Assignees: International Business Machines Corporation, Armonk, N.Y.; Siemens Aktiengesellshaft, Munich, Germany; Kabushiki Kaisha Toshiba, Tokyo, Japan

[21] Appl. No.: 402,378

[22] Filed: Mar. 13, 1995

[51] Int. Cl.⁶ .................................................. H01L 21/302
[52] U.S. Cl. ......................... 156/643.1; 156/659.11; 156/657.1; 156/651.1; 216/67; 216/37; 216/80
[58] Field of Search ..................... 156/643.1, 657.1, 156/659.11, 651.1, 662.1, 345 P; 216/2, 41, 67, 37, 80; 204/192.32, 192.37, 298.31

[56] References Cited

U.S. PATENT DOCUMENTS

| | | | |
|---|---|---|---|
| 4,261,762 | 4/1981 | King | 148/1.5 |
| 4,457,359 | 7/1984 | Holden | 165/80 |
| 4,508,161 | 4/1985 | Holden | 165/1 |
| 4,533,430 | 8/1985 | Bower | 156/651.1 X |
| 4,855,017 | 8/1989 | Douglas | 156/661.11 X |
| 4,903,754 | 2/1990 | Hirscher et al. | 165/1 |
| 4,949,783 | 8/1990 | Lakios et al. | 165/80.1 |
| 4,963,713 | 10/1990 | Horiuchi et al. | 219/121.43 |
| 5,001,423 | 3/1991 | Abrami et al. | 324/158 |
| 5,093,579 | 3/1992 | Amemiya et al. | 250/453.1 |
| 5,155,331 | 10/1992 | Horiuchi et al. | 219/121.43 |
| 5,191,218 | 3/1993 | Mori et al. | 250/453.11 |
| 5,203,958 | 4/1993 | Arai et al. | 156/643 |
| 5,267,607 | 12/1993 | Wada | 165/80.1 |
| 5,270,266 | 12/1993 | Hirano et al. | 437/228 |
| 5,290,381 | 3/1994 | Nozawa et al. | 156/345 |
| 5,320,982 | 6/1994 | Tsubone et al. | 437/228 |
| 5,366,002 | 11/1994 | Tepman | 165/1 |
| 5,458,734 | 10/1995 | Tsukamoto | 156/651.1 |

*Primary Examiner*—William Powell
*Attorney, Agent, or Firm*—Banner & Witcoff, Ltd.

[57] ABSTRACT

In a method of etch profile shaping through wafer temperature control during an etch process wherein deposition of a passivation film is temperature dependent, a gap between a semiconductor wafer to be etched and a cathode is pressurized at a first pressure, and the pressure in the gap is changed to a second pressure at a predetermined time during the etch process, thereby altering heat transfer from the semiconductor wafer to the cathode. The temperature of the wafer is adjusted one or more times during an etching process to control profile shaping of deep trenches, contact holes and shapes for mask opening shaping during the etch process.

26 Claims, 8 Drawing Sheets

ETCH PROFILE SHAPING THROUGH WAFER TEMPERATURE CONTROL

BACKGROUND OF THE INVENTION

1. Technical Field

The present invention relates to a method for forming specific etched shapes of deep trenches, contact holes, and mask openings on a semiconductor wafer. The present invention further relates to structures formed in these etched openings such as capacitors which are formed in etched deep trenches.

2. Description of Related Art

In manufacturing integrated circuits, semiconductor wafers may be completely coated with one or more layers of materials such as silicon dioxide, silicon nitride, or a metal. The unwanted material is then selectively removed using one or more etching processes, for example, by etching through a mask. Sometimes various patterns are etched directly onto the semiconductor surface. For example, circular holes or grooves may be made where trench capacitors are to be formed. Most integrated circuit etching removes material in selected regions only and is carried out using a series of related processing steps. First, a semiconductor wafer is coated with an adherent and etch-resistant photoresist. The photoresist is then selectively removed to leave a desired pattern. Etching is then carried out to transfer the mask pattern to the underlying material. The photoresist is then removed (stripped) and the wafer is cleaned.

Possible kinds of etching include wet chemical, electrochemical, plasma etching, reactive ion etching, ion beam milling, sputtering, and high-temperature vapor etching. Plasma etching is now commonly used in fine-geometry applications such as the fabrication of semiconductor memory devices. As the integration density of semiconductor integrated circuits increases, it will be desirable to improve the controllability of such etching processes for forming specific shapes of etched features such as deep trenches, contact holes, and openings on a semiconductor wafer.

SUMMARY OF THE INVENTION

The instant invention relates to a method of etch profile shaping through wafer temperature control wherein the temperature of the wafer is changed at one or more predetermined times during an etching process, resulting in two or more distinct sidewall profiles in a single deep trench. Specific deep trench shapes, contact hole shapes, and shapes for mask open etching can be achieved by means of 1) a variation of the helium or other gas pressure in the gap between the wafer and cathode during etching (the backfilling pressure of the wafer); 2) a variation of the applied RF power, i.e., increasing or decreasing ion bombardment of the wafer; or 3) a variation of the cathode coolant temperature.

With reference to the method of varying the wafer backfilling pressure, the wafer temperature can be controlled effectively by changing the pressure of the gas filled into the gap between the wafer and the cathode. If this pressure is changed during the etch process, different taper angles for the upper and lower portions of the trenches can be achieved. This pressure change can be accomplished in a very short period of time and thus has an immediate effect on the wafer temperature.

Accordingly, a method for etch profile shaping through wafer temperature control during an etch process wherein deposition of a passivation film is temperature dependent according to the present invention includes the steps of pressurizing a gap between a semiconductor wafer to be etched and a cathode at a first pressure, and changing the pressure in the gap to a second pressure at a predetermined time during the etch process, thereby altering heat transfer from the semiconductor wafer to the cathode.

With reference to the method of varying the applied RF power, wafer temperature may be effectively controlled during etching by increasing or decreasing the applied RF power, thereby respectively increasing or decreasing the ion bombardment of the wafer. When the applied RF power (ion bombardment) is increased, the wafer temperature rises. When the applied RF power (ion bombardment) is decreased, the wafer temperature falls. By varying the applied RF power, the temperature of the wafer may be rapidly altered during the etching process.

Accordingly, a second method for etch profile shaping through wafer temperature control during an etch process wherein deposition of a passivation film is temperature dependent according to the present invention includes the steps of applying a first level of RF power to a wafer during a first time period of an etching process, and, after the first period of time, applying a second level of RF power to the wafer, thereby rapidly altering the wafer temperature during the etching process.

With reference to varying the cathode coolant temperature, wafer temperature control during etching can be accomplished by altering the cathode coolant temperature, thereby increasing or decreasing the heat transfer from the wafer to the chuck and changing the temperature of the wafer.

Accordingly, a third method for etch profile shaping through wafer temperature control during an etch process wherein deposition of a passivation film is temperature dependent according to the present invention includes the steps of applying cathode coolant of a first temperature to a cathode during a first time period of an etching process, and, after the first period of time, applying cathode coolant at a second temperature to the cathode, thereby altering the wafer temperature during the etching process.

Various additional advantages and features of novelty which characterize the invention are further pointed out in the claims that follow. However, for a better understanding of the invention and its advantages, reference should be made to the accompanying drawings and descriptive matter which illustrate and describe preferred embodiments of the invention.

DETAILED DESCRIPTION

The present invention will be described below in terms of an etch process during the fabrication of a semiconductor memory device. However, the invention is not limited in this respect and is generally applicable to any etch process involving a side wall passivation film where the deposition of the passivation film is temperature dependent.

The requirements for highly integrated memory chips, for example, 256 megabit DRAM memory chips, combine high aspect ratio features with tight critical dimension and shape requirements. It has been found, for example, that the shape of the deep trenches in which the trench capacitors of such memory chips are formed is important. Vertical trench side walls result in maximum memory capacity of each capacitor formed within the deep trenches, but may also result in voids in the polysilicon which is used to fill the trenches. Tapered trench side walls produce void-free polysilicon fillings but reduce the memory capacitance of the capacitors. Therefore, the optimum trench profile has tapered upper side walls where voids in the polysilicon are most disturbing to the operation of the memory device and substantially vertical lower side walls in order to maximize memory capacity. Such trench capacitors require trenches having a depth of 8 micrometers and openings approximately 0.3 micrometers by 0.5 micrometers in width. For void-free filling of the trenches, slightly tapered side walls in the upper part of the trench are advantageous. For example, a taper angle of approximately 87.5° to 88.5° from the surface of the wafer to a depth of approximately 1.5 micrometers of the trench is desirable. Below the tapered depth of approximately 1.5 micrometers, the trench side walls should be vertical or nearly vertical to maximize the capacitor surface area.

The deep trench etch process may be based on HBr/fluorine chemistry with small additions of oxygen. The oxygen forms together with silicon containing etch products a wall passivation film. The deposition of the side wall passivation film is dependent upon wafer temperature. Lower temperatures lead to stronger deposition, faster reduction mask opening diameter and thus a stronger taper. Higher wafer temperatures can side wall deposition to a point where reentrant profiles can be achieved.

Figure 1:
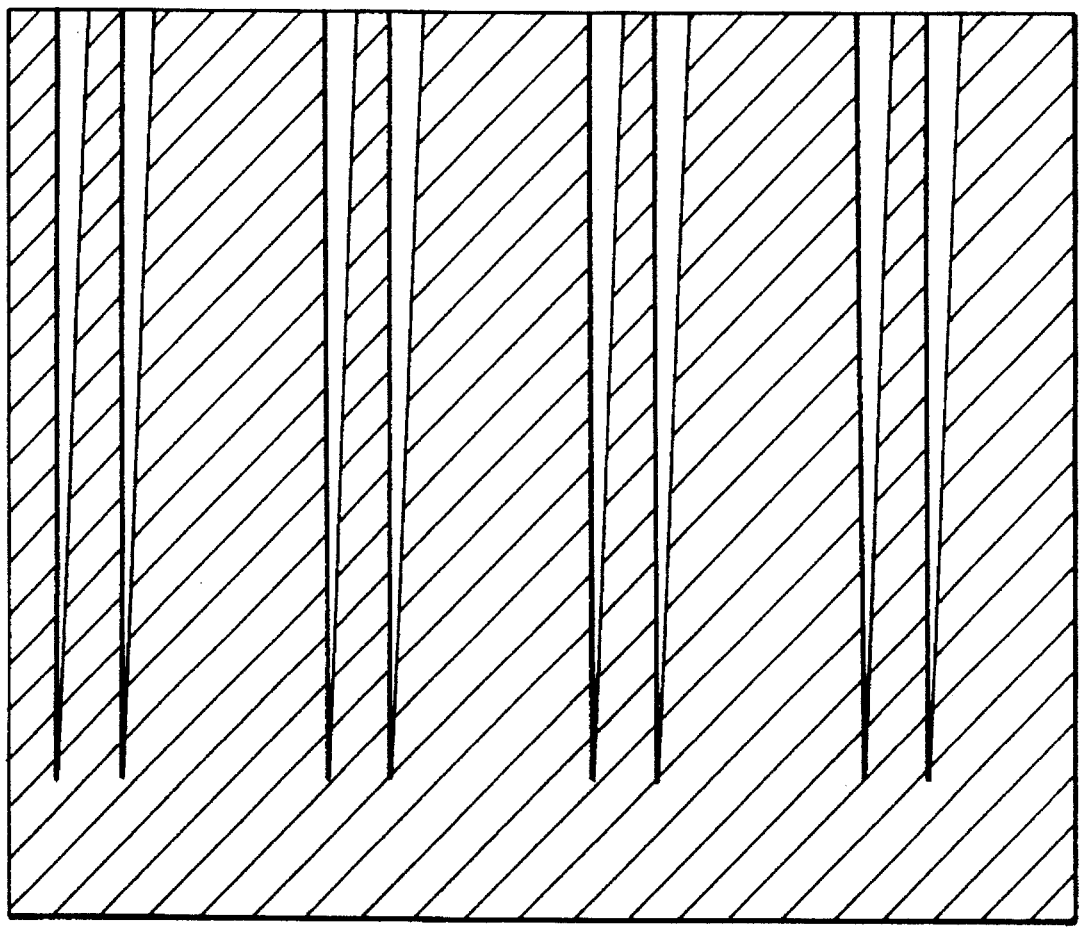
FIGS. 1 and 2 illustrate deep trenches with different tapers.
Figure 2:
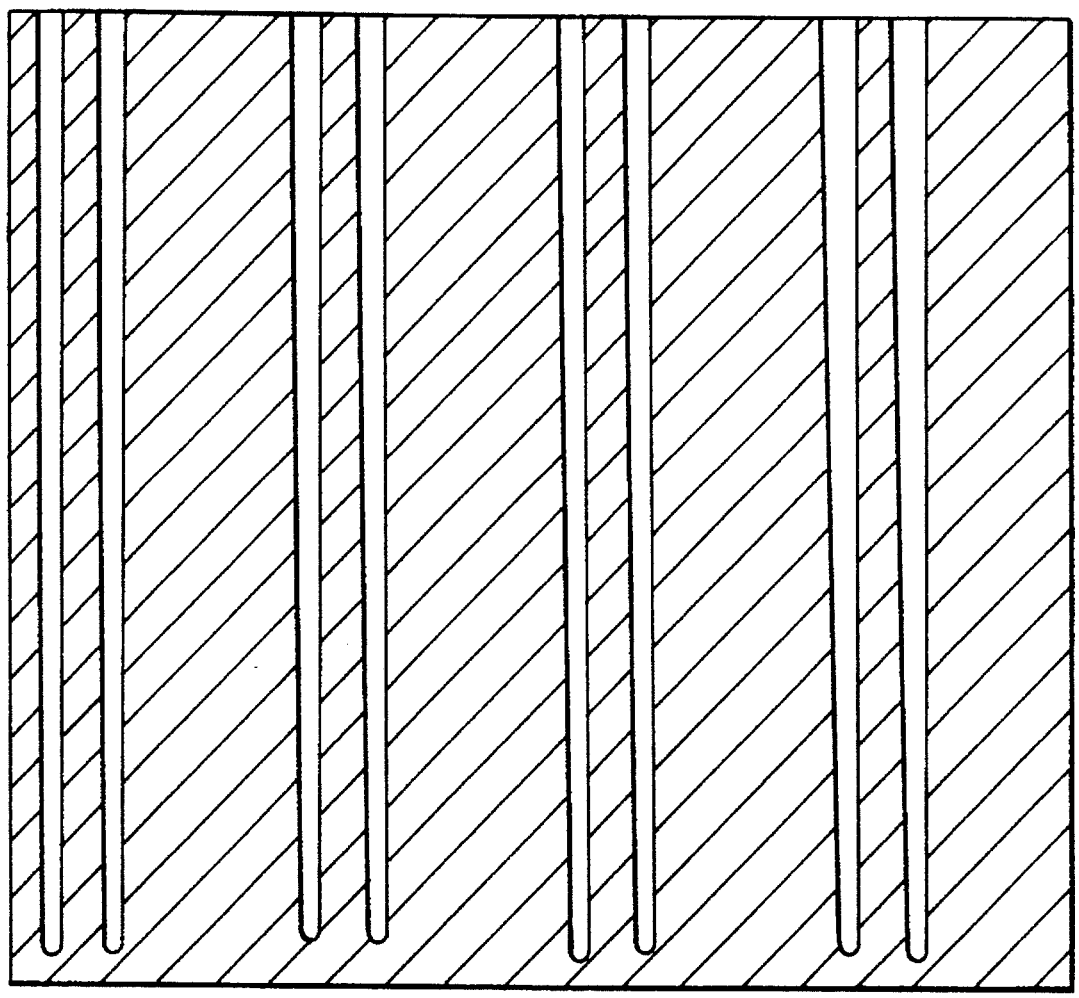

Examples of trenches formed when a wafer is held at one temperature during etching are illustrated in FIGS. 1 and 2. Use of a cathode coolant having a temperature of 10° C. during a deep trench etching process using HBr, $NF_3$ and $O_2$ results in a lower wafer temperature (e.g., 125° C.) and trenches being strongly tapered as shown in FIG. 1. Use of a cathode coolant having a temperature of 30° C. during the same deep trench etching process results in a higher wafer temperature (e.g., 145° C.) and trenches being less tapered as shown in FIG. 2.

Figure 3:
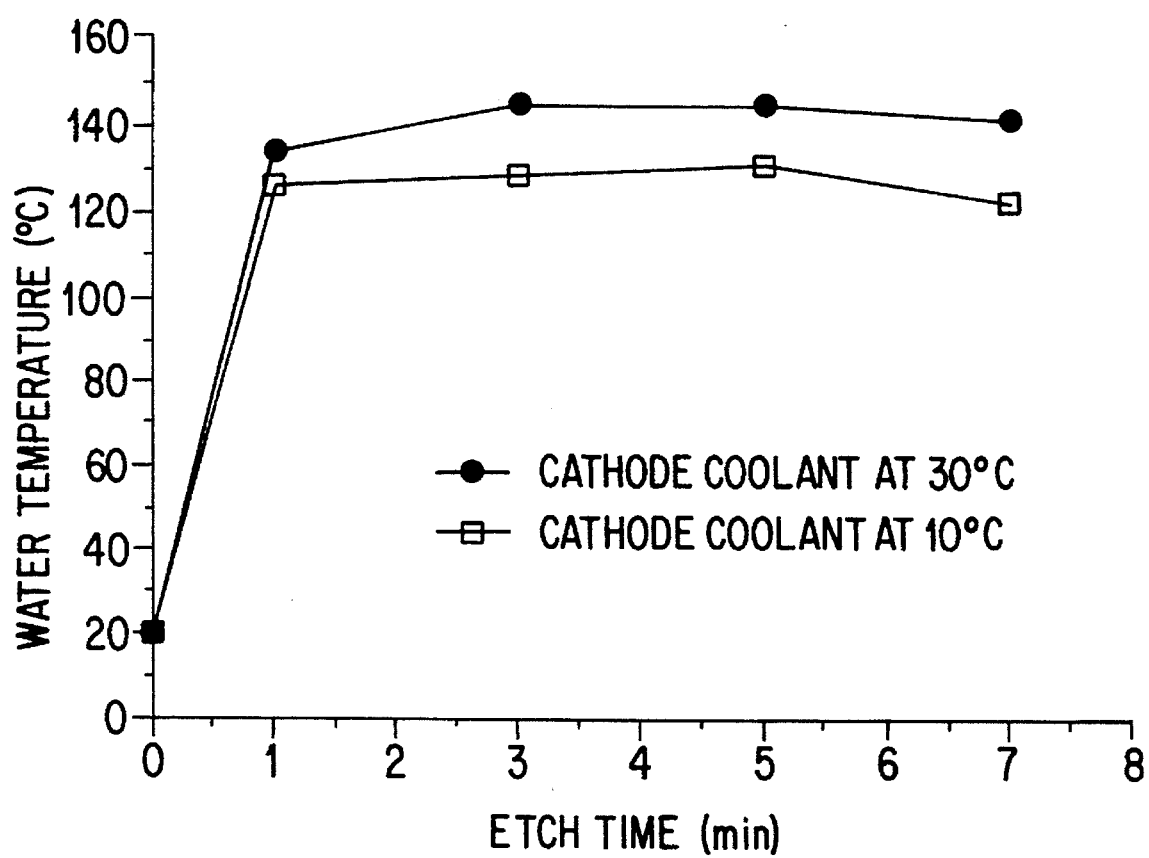
FIG. 3 provides a graph of the temperature change of a wafer during a dry etching process using cathode coolants of two different temperatures.

The change in taper angle of the deep trenches shown in FIGS. 1 and 2 can be correlated with the increasing wafer temperature during the etch period. Before the plasma is ignited, the wafer is close to ambient temperature. Shortly after the plasma is ignited, for example using a radio frequency (RF) power of 1.3 kilowatts, the wafer temperature increases rapidly as shown in the chart of FIG. 3 in which wafer temperature is plotted against time during the conventional dry etching process. The wafer temperatures are plotted for two cathode cooling fluid temperatures, 10° C. and 30° C. The curves show that the wafer temperature rises to over 100° C. in the first minute of etching and then remains fairly constant over the remaining duration of the etching process. Within the first minute, an etch depth of approximately 1.5 micrometers is reached. The remaining six minutes of the etching period create approximately 6 micrometers of additional trench depth.

A method which improves the controllability of the etching process and which produces deep trenches having the advantageous characteristics set forth above will be described with reference to FIGS. 4–6. While the method is described in the context of deep trench etching for a trench capacitor of a semiconductor memory device, it may also be used for etch profile shaping of contact holes, shapes for mask open etching and other appropriate etch processes as noted above.

Figure 6A:
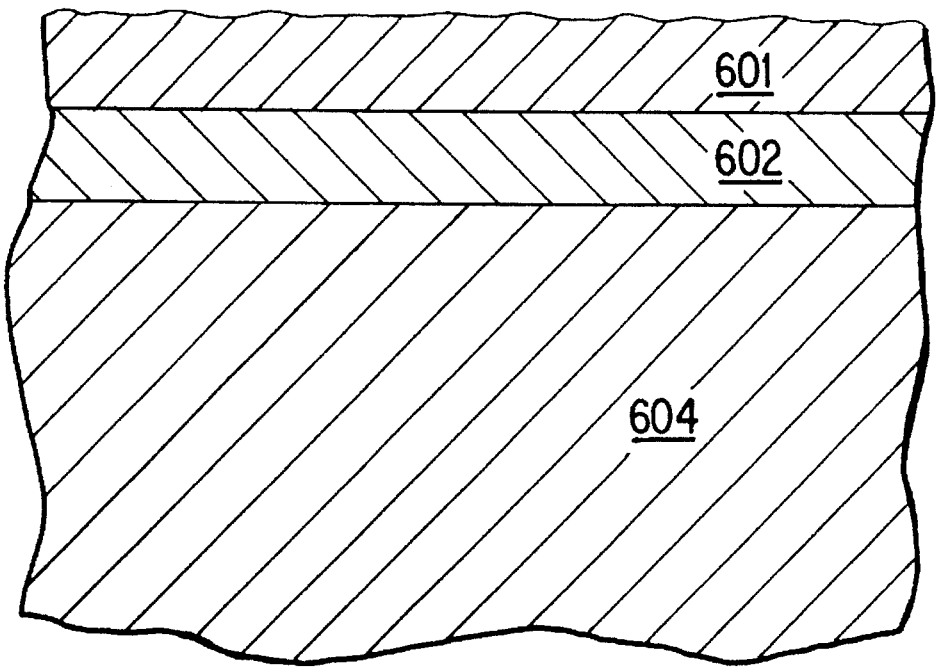
FIGS. 6A, 6B, and 6C provide diagrams of the formation and structure of the layers used in a deep trench etching process during which the method according to the present invention is performed.
Figure 6B:
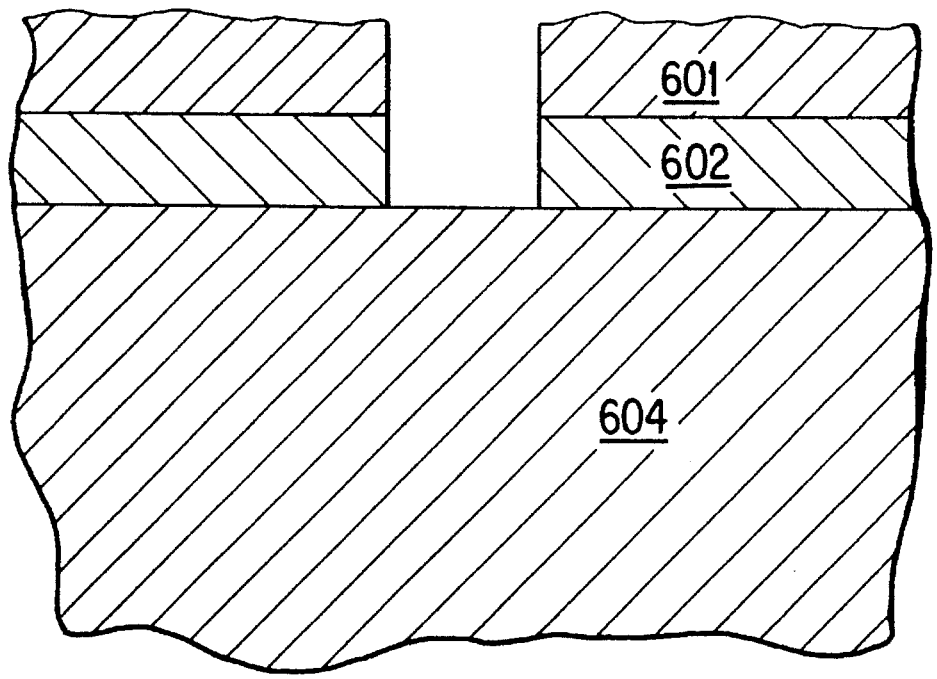
Figure 6C:
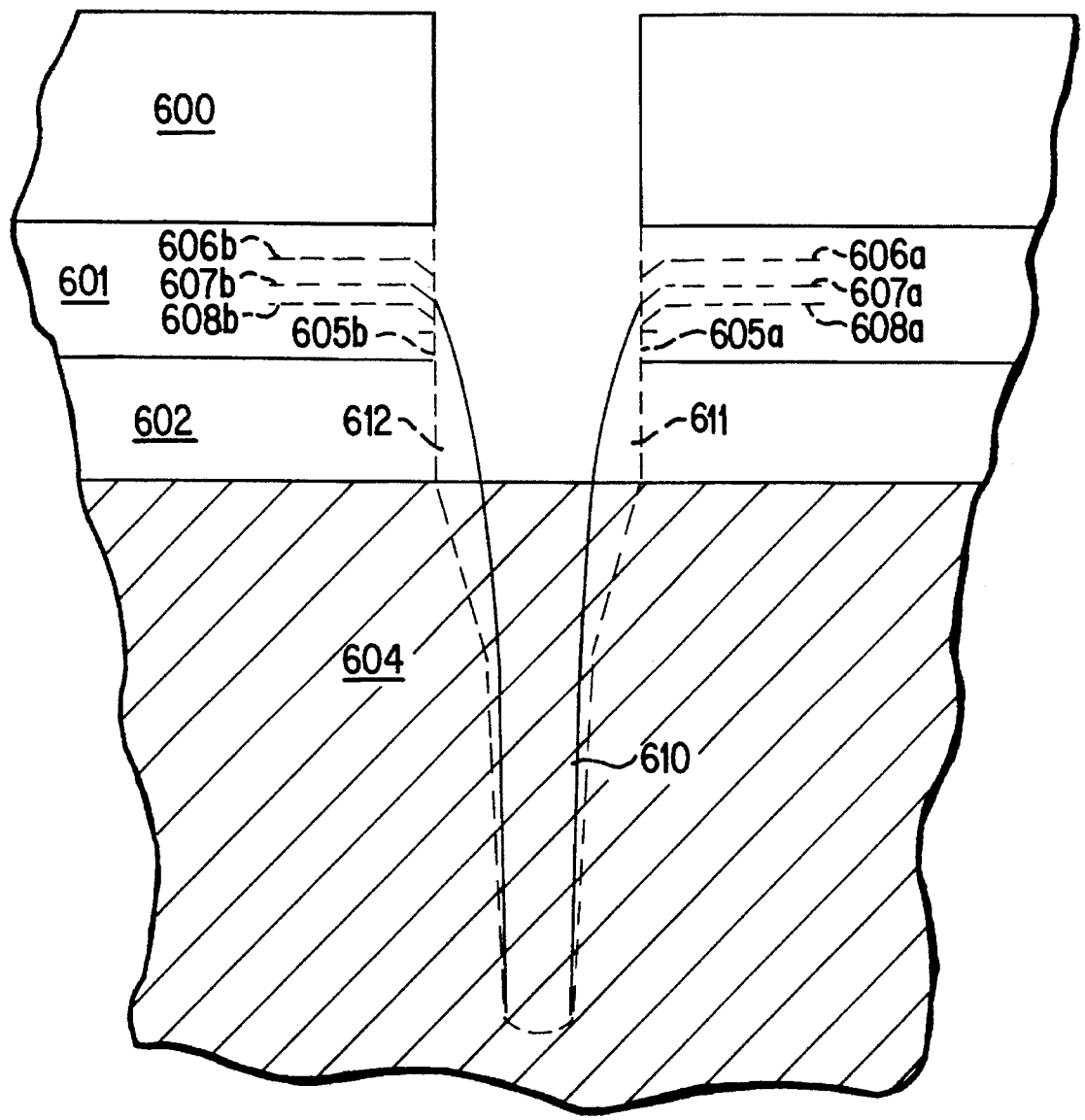

With reference to FIGS. 6A–C, deep trench etching for producing the desired trench profile may be performed using a hard mask including layers of different materials, for example, 800 nm TEOS (layer 601) on 240 nm of LPCVD (low pressure chemical vapor deposition) nitride (SIN) (layer 602). For example, LPCVD nitride layer 602 and TEOS layer 601 are successively deposited on a semiconductor substrate 604 as shown in FIG. 6A. A resist 600 is then formed above the TEOS layer 601. A mask open etch is performed to transfer the deep trench pattern through the TEOS layer 601 and the LPCVD nitride layer 602 as shown in FIG. 6B. The resist layer 600 is then removed, and etching is performed on substrate 604 to form a deep trench 610. During the etching process, a passivation film is deposited on the sidewalls of the TEOS layer 601, the LPCVD nitride layer 602 and the trench 610. Examples of such a deposition of passivation film on the sidewalls of the LPCVD nitride layer 602 and trench 610 are shown in FIG. 6C marked as 611 and 612. During the etching process, upper portions of the TEOS layer 601 are etched away by ion bombardment as indicated by layer lines 606a–b, 607a–b, and 608a–b.

Figure 4:
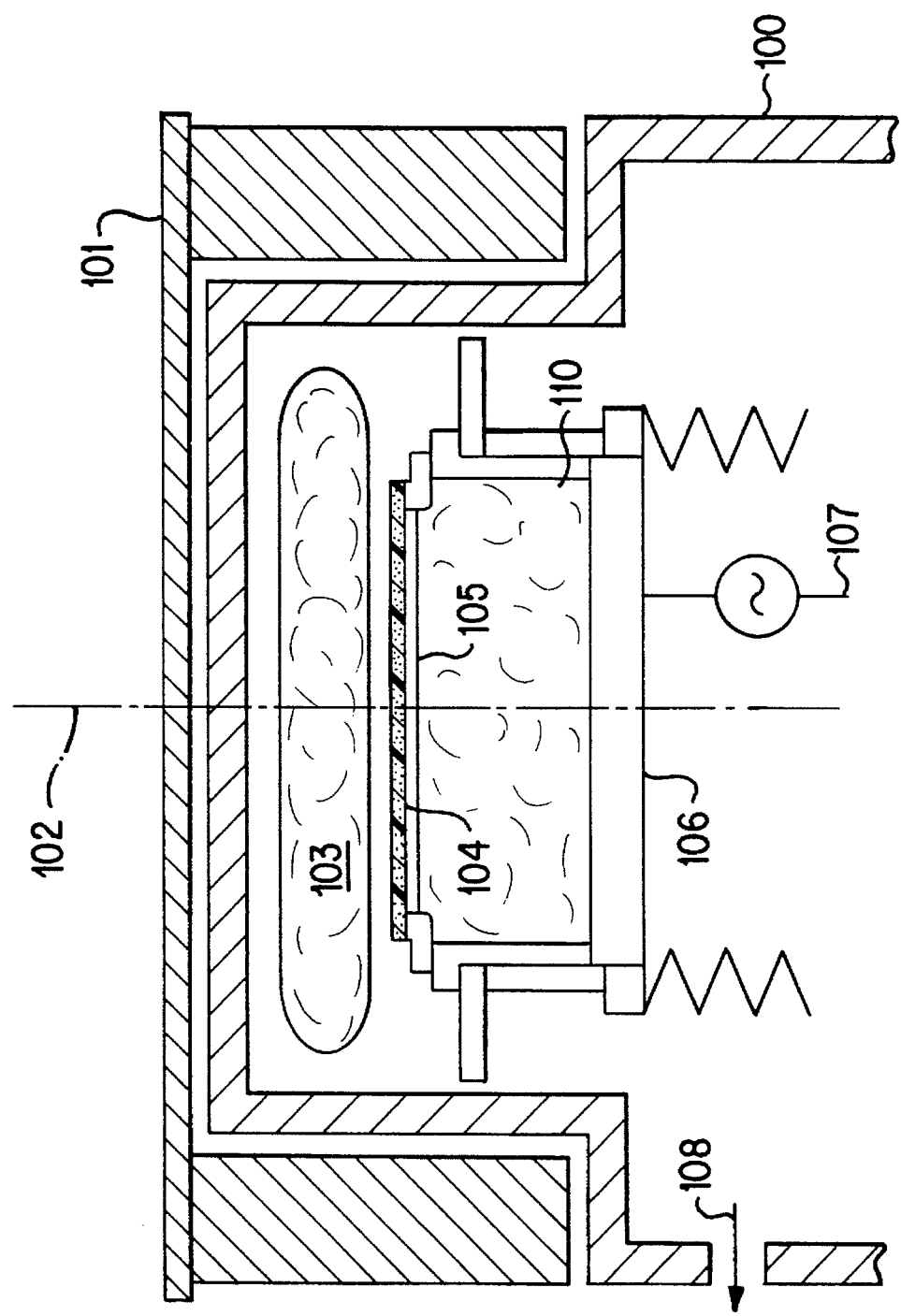
FIG. 4 provides a diagram of an etching apparatus used to carry out the etching method according to the present invention.

One type of etch chamber structure used to carry out the method according to the present invention is shown in FIG. 4. The etch chamber 100 is partially surrounded by a rotating permanent magnet assembly 101 including a dipole ring permanent magnet which rotates mechanically around the chamber on an axis of rotation 102. Inside the etch chamber 100, a wafer 104 is mounted on an electrostatic chuck (ESC) 105 which suspends the wafer 104 at a distance above a cathode 106 to which, for example, 13.56 MHz of RF power, is applied through an electrode 107. A mask (e.g., layer 602 in FIGS. 6A–C) is positioned on the surface of the semiconductor wafer 104. The cathode 106 is liquid cooled with a suitable coolant liquid at a predetermined temperature. The etch plasma 103 is ignited at the beginning of the etching process in the upper portion of the etch chamber 100. The pressure within the etch chamber 100 is kept constant during the etching process.

The gap 110 between the wafer 104 and chuck 105 on the top and the cathode 106 on the bottom is filled with helium or one or more other suitable gases with a pressure in the range of 1 to 10 Torr to assure a good heat transfer between the wafer 104 and the ESC 105. If helium gas is used, the ESC 105 is said to have a helium backfilling. In the apparatus of FIG. 4, the gap 110 is filled with gas such as Helium slightly after ignition of the plasma 103, as the plasma creates the electric path needed to hold the wafer 104 onto the ESC 105 when backfilling pressure is applied. However, other appropriate initial procedures may be used with other types of etching devices which are employed to carry out the method according to the present invention.

In a method of etch profile shaping through wafer temperature control according to the present invention, the gas-filled gap 110 is pressurized at a first pressure for a first time period during the etching process. At the end of the first time period, the pressure in the gap 110 is rapidly changed to a second pressure for a second period of time which may be the remainder of the etching process time. The heat transfer coefficients of the gas-filled gap 110 are strongly pressure dependent. Furthermore, the pressure in the gap 110 can be changed rapidly. Rapid changes to the pressure in the gap 110 have a significant impact on the wafer temperature because the heat capacity (e.g., 0.705 J/gK) of the object whose temperature is to be changed, i.e., the wafer 104, is minimal. The change in pressure affects the heat transfer from the wafer 104 to the cooled cathode 106 by controlling the thermal conductivity between the wafer 104 and the ESC 105. A reduction in pressure reduces the heat transfer from the wafer 104, and thus increases the wafer temperature. Similarly, an increase in pressure increases heat transfer from the wafer 104 and thus decreases the wafer temperature.

As a result of the change in pressure in the gap 110 at the end of the first time period, the temperature of the wafer 104 rapidly changes, thereby determining the shape of the deep trenches or contact holes, or shapes for mask open etching. Because the pressure change may be accomplished in a very short time, the effect on the temperature of the wafer 104 is immediate. For example, the temperature of the wafer 104 may be increased by approximately 50° C. over a time of several seconds.

Figure 5A:
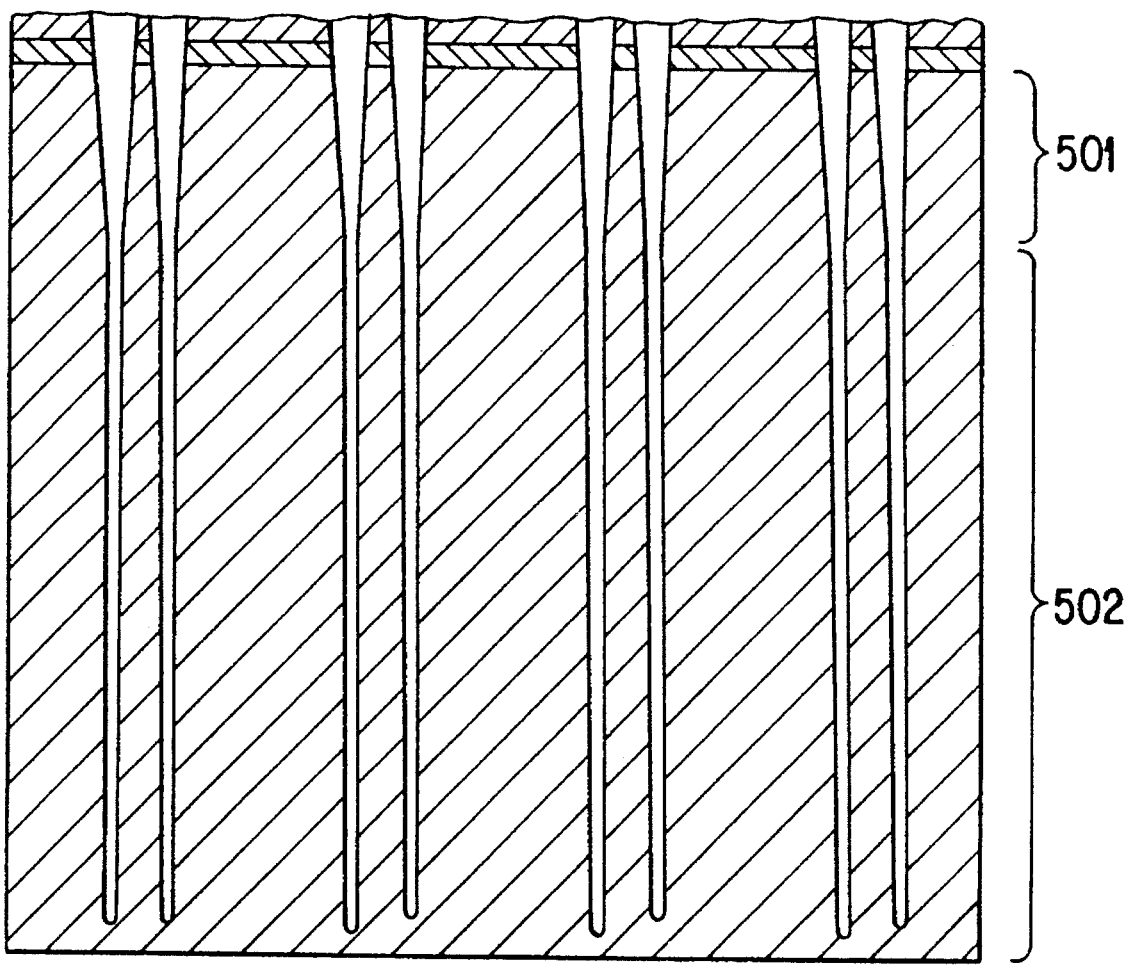
FIGS. 5A and 5B illustrate deep trenches with desired upper and lower sidewall taper produced by the method according to the present invention.
Figure 5B:
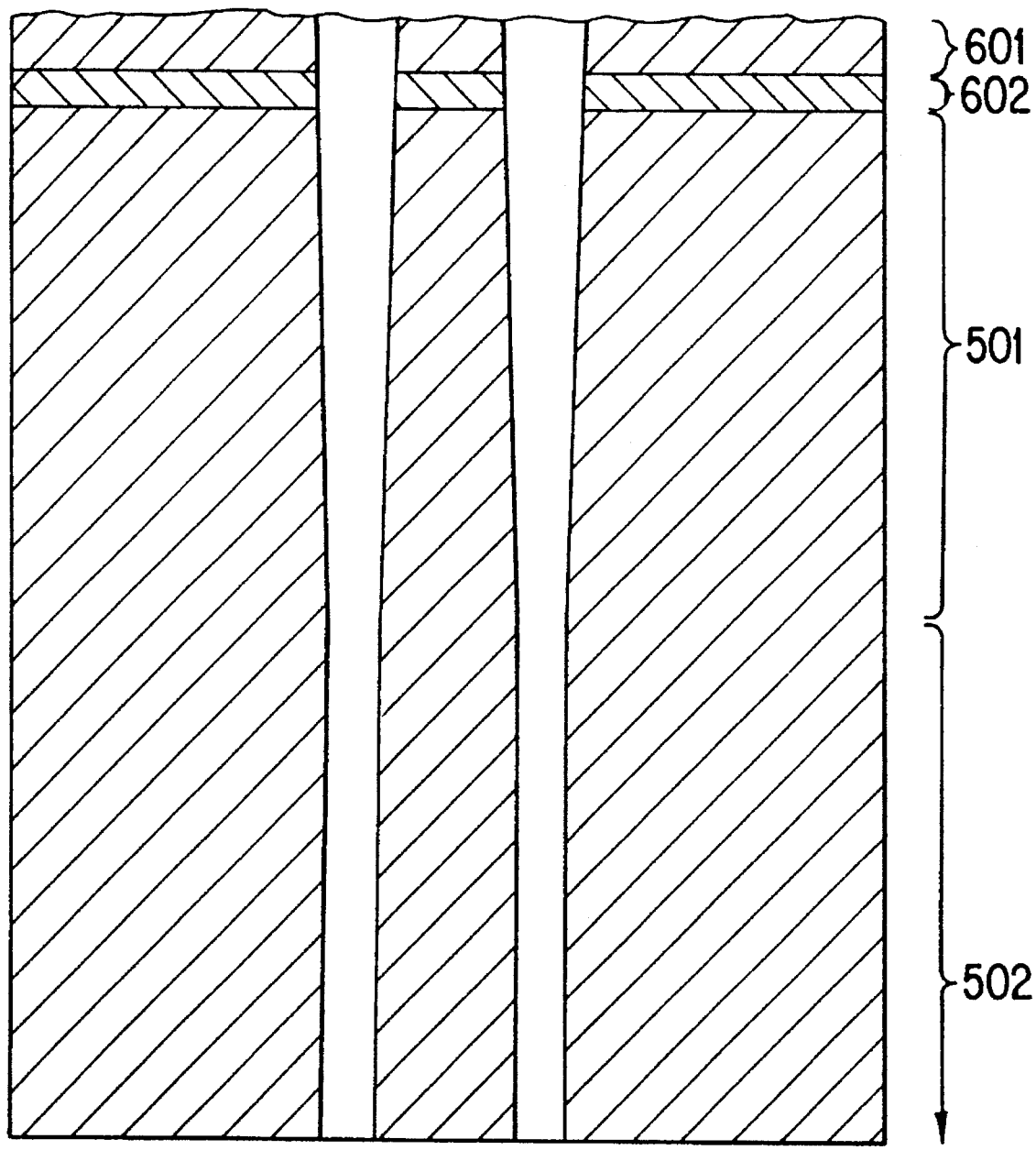

FIGS. 5A and 5B illustrate deep trenches that are formed using the backfilling pressure variation method according to the present invention. Specifically, the initial pressure of the helium-filled gap 110 is 15 Torr. This initial pressure is maintained for 70 seconds of etch time. After 70 seconds, the gap pressure is decreased to 5 Torr for the remaining 6 minutes of etch time. A 30° C. coolant may be used. According to this particular etch process, after the plasma is ignited using 1.0 to 1.5 KW of RF power, the wafer temperature rises rapidly. The thermal conductivity between the wafer 104 and the ESC 105 is relatively high to achieve a rapid heat transfer from the wafer 104 to the cathode 106, resulting in a lower wafer temperature and the desired tapered sidewall profile for the upper portion 501 of the trench. After 70 seconds, the pressure in the gap 110 is decreased to 5 Torr, decreasing the thermal conductivity between the wafer 104 and the ESC 105 and thus decreasing the heat transfer from the wafer 104 to the cathode 106. This allows the wafer 104 to heat up more, thereby reducing the taper and resulting in the desired vertical sidewall profile for the lower portion 502 of the trenches over the remaining 6 minutes of the etching process.

FIG. 5A illustrates the full trenches formed by the method according to the present invention, and FIG. 5B illustrates the upper portion of the trenches shown in FIG. 5A, including upper portion 501 and part of lower portion 502 shown in FIG. 5A. The taper angles of the trenches shown in FIGS. 5A and 5B are 87.6° for the upper 1.5 micrometers (marked as 501) of the trenches and 90° for the lower portion (marked as 502) of the trenches. These trenches meet the shape requirements for highly integrated DRAM memory chips.

The method of varying backfilling pressure to control trench profile shaping according to the present invention also enables control of the etch rate such that the etch rate may be varied one or more times during a single etching process. During the etching process, a passivation film, for example, a silicon oxide film, is continuously deposited on the exposed surfaces including the trench sidewalls. Ion bombardment continually removes the deposited passivation film. During an etching process, it may be desirable to alter the equilibrium between passivation film deposition and passivation film removal by ion bombardment one or more times, for example, to achieve a specific etch rate combined with a desired trench shape. For example, if the wafer temperature is raised, ion bombardment remains constant and deposition of the passivation film is diminished, resulting in a faster silicon etch rate and a more vertical trench sidewall profile. If the wafer temperature is lowered, ion bombardment remains constant and passivation film deposition is enhanced, resulting in a reduced etch rate and a more tapered trench sidewall profile. Therefore, the method of varying wafer temperature according to the present invention may be used to control the etch rate during a single etching process by varying the etch rate one or more times during the etching process.

In addition to the method of etch profile shaping through backfilling pressure variations described above, a second method of etch profile shaping through wafer temperature control according to the present invention is accomplished by varying the applied RF power during the etching process. As more RF power is applied, the ion bombardment of the wafer 104 increases, and the temperature of the wafer 104 increases. If the applied RF power is reduced, ion bombardment decreases as does the wafer 104 temperature. The temperature change to the wafer 104 as a result of applied RF power variations is rapid, thereby allowing for etch profile shaping by changing the wafer temperature at one or more times during the etching process.

In the method according to the present invention in which trench profile shaping is accomplished by varying the applied RF power, an increase in the applied RF power may result in a decrease in the selection ratio or selectivity of the etching process. The selectivity of the etching process is the ratio between the etch rate of the material to be patterned and a material not to be etched which can be a masking material, e.g., TEOS in the present example, or a stopping layer. A high selectivity in the present example indicates that the material to be patterned can be etched with minimal etching of the masking material, while a low selectivity indicates that a significant amount of the masking material will also be etched. In the method of varying the applied RF power according to the present invention, as the applied RF power increases, the ion bombardment of the wafer increases (the ion current density and energy of the ions bombarding the wafer and mask increase), thereby decreasing selectivity of the etching process. Therefore, increases in the applied RF power may be limited in order to achieve or maintain a desired selectivity.

Further, in the method of varying the applied RF power according to the present invention, as increasing RF power is applied, the plasma constituents may also change. For example, if $NF_3$ gas is used in the etching process, the increased power may further fragment this gas. This effect may also limit the amount of increase of applied RF power during the etching process.

A third method of etch profile shaping through wafer temperature control according to the present invention is accomplished by changing the temperature of the cathode coolant circulated within the cathode 106 during the etching process. By increasing the temperature of the cathode coolant, the heat conductivity between the wafer 104 and the ESC 105 is decreased (less heat is transferred from the wafer 104 to the ESC 105), thereby heating up the wafer 104. If the temperature of the cathode coolant is decreased, the heat conductivity between the wafer 104 and the ESC 105 is increased (more heat is transferred from the wafer 104 to the ESC 105), thereby cooling the wafer 104.

Current methods of varying the cathode coolant during the etching process are too slow to be used in on-line processing of wafers. For example, a 20° C. change in cathode coolant temperature is accomplished over a period of approximately ½ hour. However, this method of etch profile shaping through wafer temperature control may be used in off-line applications. Also, more efficient and more rapid methods of varying the temperature of the cathode coolant will increase the applicability of this method of wafer temperature variation during etching.

The three methods of etch profile shaping through variations of wafer temperature during etching according to the present invention may be used for all etch processes involving a side wall passivation film where the deposition of the passivation film is temperature dependent. For example, a deep trench etch process may be based on $HBr/NF_3$ chemistry with small additions of $O_2$. The oxygen forms together with the silicon-containing etch products (e.g., $SiF_4$) a side wall passivation film (e.g., $SiO_2$). The deposition of the side wall passivation film is dependent upon the wafer temperature. Lower temperatures lead to stronger deposition, faster reduction of the mask opening diameter, and thus a stronger taper. Higher wafer temperatures can reduce the side wall deposition of the passivation film to the point where reentrant profiles can be achieved. Therefore, rapid changes in the temperature of the wafer at a predetermined time during the etching process control the etch profile shaping of the deep trenches, contact holes, etc. As discussed above, these rapid wafer temperature changes may also be used to control the etch rate during the etching process.

In manufacturing a 256-Megabit DRAM, capacitors are formed in the deep trenches which are etched in the manner described above. These capacitors may be formed using any known technique such as the technique described in Nesbit et al., "A 0.6 Micrometer$^2$ 256-Megabit DRAM Cell with Self-Aligned BuriEd STrap (BEST)," IEDM Dig. Tech. Papers, December 1993, pp. 627–630, which is expressly incorporated herein by reference.

While the present invention has been particularly described with reference to the preferred embodiments, it should be readily apparent to those of ordinary skill in the art that changes and modifications in form and details may be made without departing from the spirit and scope of the invention. It is intended that the appended claims include such changes and modifications.

We claim:

1. A method of etch profile shaping wafer temperature control during an etch process wherein deposition of a passivation film is temperature dependent, comprising the steps of:

pressurizing a gap between a semiconductor wafer to be etched and a cathode at a first pressure; and changing the pressuring in said gap to a second pressure at a first time during the etch process, thereby altering heat transfer from said semiconductor wafer to said cathode.

2. A method according to claim 1, wherein said gap is pressurized with helium gas.

3. A method according to claim 1, wherein said first pressure is higher than said second pressure, thereby reducing said heat transfer at said first time.

4. A method for etch profile shaping through wafer temperature control during an etching process wherein deposition of a passivation film is temperature dependent, comprising the steps of:

applying a first level of RF power to a wafer during a first time period of an etching process; and after said first period of time, applying a second level of RF power to the wafer, thereby rapidly altering the temperature of said wafer during the etching process.

5. A method according to claim 4, wherein said first level of RF power is less than said second level of RF power, thereby increasing said temperature of said wafer after said first time period.

6. A method according to claim 4, wherein said first time period is at least one minute.

7. A method for etch profile shaping through wafer temperature control during an etching process wherein deposition of a passivation film is temperature dependent, comprising the steps of:

applying cathode coolant of a first temperature to a cathode within an etching chamber during a first time period of an etching process; and after said first period of time, applying cathode coolant of a second temperature to said cathode, thereby altering the temperature of said wafer during the etching process.

8. A method according to claim 7, wherein said first cathode coolant temperature is less than said second cathode coolant temperature, thereby increasing said temperature of said semiconductor wafer after said first time period.

9. A method of etch profile shaping through wafer temperature control during an etch process wherein deposition of a passivation film is temperature dependent, comprising the steps of:

pressurizing a gap between a semiconductor wafer and a cathode at a first pressure during a first period of an etching process to bring the temperature of the semiconductor wafer to a first temperature such that a first amount of passivation film is deposited during the first period of the etching process; and changing the pressure in said gap to a second pressure after said first period of the etching process to bring the temperature of the semiconductor wafer to a second temperature such that a second amount of passivation film is deposited after the first period of the etching process.

10. A method according to claim 9, wherein said first pressure is greater than said second pressure, said first temperature is less than said second temperature, and said first amount of deposited passivation is greater than said second amount of deposited passivation film.

11. A method of deep trench profile shaping through wafer temperature control during an etch process wherein deposition of a passivation film is temperature dependent, comprising the steps of:

pressurizing a gap between a semiconductor wafer and a cathode at a first pressure during a first period of a deep trench etching process to bring the temperature of the semiconductor wafer to a first temperature such that a first amount of passivation film is deposited on sidewalls of one or more deep trenches during the first period of the etching process; and changing the pressure in said gap to a second pressure after said first period of the deep trench etching process to bring the temperature of the semiconductor wafer to a second temperature such that a second amount of passivation film is deposited on the sidewalls of said one or more deep trenches after the first period of the etching process.

12. A method according to claim 11 wherein said first pressure is higher than said second pressure, said first temperature is lower than said second temperature, and said first amount of deposited passivation film is greater than said second amount of deposited passivation film, resulting in said one or more deep trenches having tapered upper sidewall portions and substantially vertical lower sidewall portions.

13. A method according to claim 12, wherein said upper sidewall portions of said one or more deep trenches extend to a depth of approximately 1.5 micrometers from the surface of the semiconductor wafer and said lower sidewall portions extend below said upper sidewall portions of said one or more deep trenches.

14. A method of etch profile shaping through wafer temperature control during an etch process wherein deposition of a passivation film is temperature dependent, comprising the steps of:

applying a first level of RF power to a semiconductor wafer during a first period of an etching process to bring the temperature of the semiconductor wafer to a first temperature such that a first amount of passivation film is deposited during the first period of the etching process; and applying a second level of RF power to the semiconductor wafer after said first period of the etching process to bring the temperature of the semiconductor wafer to a second temperature such that a second amount of passivation film is deposited after the first period of the etching process.

15. A method according to claim 14, wherein said first RF power level is less than said second RF power level, said first temperature is less than said second temperature, and said first amount of deposited passivation film is greater than said second amount of deposited passivation film.

16. A method of deep trench profile shaping through wafer temperature control during an etch process wherein deposition of a passivation film is temperature dependent, comprising the steps of:

applying a first level of RF power to a semiconductor wafer during a first period of a deep trench etching process to bring the temperature of the semiconductor wafer to a first temperature such that a first amount of passivation film is deposited on sidewalls of one or more deep trenches during the first period of the deep trench etching process; and applying a second level of RF power to the semiconductor wafer after said first period of the deep trench etching process to bring the temperature of the semiconductor wafer to a second temperature such that a second amount of passivation film is deposited on the sidewalls of said one or more deep trenches after the first period of the etching process.

17. A method according to claim 16 wherein said first RF power level is less than said second RF power level, said first temperature is lower than said second temperature, and said first amount of deposited passivation film is greater than said second amount of deposited passivation film, resulting in said one or more deep trenches having tapered upper sidewall portions and substantially vertical lower sidewall portions.

18. A method according to claim 17, wherein said upper sidewall portions of said one or more deep trenches extend to a depth of approximately 1.5 micrometers from the surface of the semiconductor wafer and said lower sidewall portions extend below said upper sidewall portions of said one or more deep trenches.

19. A method of etch profile shaping through wafer temperature control during an etch process wherein deposition of a passivation film is temperature dependent, comprising the steps of:

applying cathode coolant of a first temperature to a cathode within an etching chamber during a first period of an etching process to bring the temperature of a semiconductor wafer positioned within said etching chamber to a first temperature such that a first amount of passivation film is deposited during the first period of the etching process; and applying cathode coolant of a second temperature to said cathode after said first period of the etching process to bring the temperature of the semiconductor wafer to a second temperature such that a second amount of passivation film is deposited after the first period of the etching process.

20. A method according to claim 19, wherein said first cathode coolant temperature is lower than said second cathode coolant temperature, said first temperature is less than said second temperature, and said first amount of deposited passivation film is greater than said second amount of deposited passivation film.

21. A method of deep trench profile shaping through wafer temperature control during an etch process wherein deposition of a passivation film is temperature dependent, comprising the steps of:

applying cathode coolant of a first temperature to a cathode within an etching chamber during a first period of a deep trench etching process to bring the temperature of a semiconductor wafer positioned within the etching chamber to a first temperature such that a first amount of passivation film is deposited on sidewalls of one or more deep trenches during the first period of the deep trench etching process; and applying cathode coolant of a second temperature to said cathode after said first period of the deep trench etching process to bring the temperature of the semiconductor wafer to a second temperature such that a second amount of passivation film is deposited on the sidewalls of said one or more deep trenches after the first period of the etching process.

22. A method according to claim 21 wherein said first cathode coolant temperature is lower than said second cathode coolant temperature, said first temperature is lower than said second temperature, and said first amount of deposited passivation film is greater than said second amount of deposited passivation film, resulting in said one or more deep trenches having tapered upper sidewall portions and substantially vertical lower sidewall portions.

23. A method according to claim 22, wherein said upper sidewall portions of said one or more deep trenches extend to a depth of approximately 1.5 micrometers from the surface of the semiconductor wafer and said lower sidewall portions extend below said upper sidewall portions of said one or more deep trenches.

24. A method of controlling an etch rate of an etching process through wafer temperature control during wherein deposition of a passivation film during the etching process is temperature dependent, comprising the steps of:

pressurizing a gap between a semiconductor wafer to be etched and a cathode at a first pressure; and changing the pressure in said gap to a second pressure at a predetermined time during the etch process, thereby altering heat transfer from said semiconductor wafer to said cathode.

25. A method for controlling an etch rate of an etching process through wafer temperature control wherein deposition of a passivation film during the etching process is temperature dependent, comprising the steps of:

applying a first level of RF power to a wafer during a first time period of an etching process; and after said first period of time, applying a second level of RF power to the wafer, thereby rapidly altering the temperature of said wafer during the etching process.

26. A method for controlling an etch rate of an etching process through wafer temperature control wherein deposition of a passivation film during the etching process is temperature dependent, comprising the steps of:

applying cathode coolant of a first temperature to a cathode within an etching chamber during a first time period of an etching process; and after said first period of time, applying cathode coolant of a second temperature to said cathode, thereby altering the temperature of said wafer during the etching process.

* * * * *